United States Patent
Ochi et al.

(10) Patent No.: US 7,872,348 B2
(45) Date of Patent: Jan. 18, 2011

(54) SEMICONDUCTOR DEVICE

(75) Inventors: Kentaro Ochi, Hitachi (JP); Akira Mishima, Mito (JP); Takuro Kanazawa, Hitachinaka (JP); Tetsuo Iijima, Maebashi (JP); Katsuo Ishizaka, Kitagunma-gun (JP); Norio Kido, Maebashi (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/797,317

(22) Filed: Jun. 9, 2010

(65) Prior Publication Data

US 2010/0315786 A1 Dec. 16, 2010

(30) Foreign Application Priority Data

Jun. 11, 2009 (JP) .............................. 2009-140454

(51) Int. Cl.
*H01L 23/34* (2006.01)
(52) U.S. Cl. .............................. 257/712; 257/E21.499
(58) Field of Classification Search ................. 257/706, 257/712–713, E21.499
See application file for complete search history.

(56) References Cited

U.S. PATENT DOCUMENTS

| | | | | |
|---|---|---|---|---|
| 7,173,333 | B2 * | 2/2007 | Hata et al. | 257/713 |
| 7,173,823 | B1 * | 2/2007 | Rinehart et al. | 361/699 |
| 2009/0261471 | A1 * | 10/2009 | Frey | 257/703 |
| 2010/0084761 | A1 * | 4/2010 | Shinagawa | 257/706 |
| 2010/0096743 | A1 * | 4/2010 | Ganesan et al. | 257/692 |
| 2010/0127387 | A1 * | 5/2010 | Soda et al. | 257/706 |
| 2010/0181665 | A1 * | 7/2010 | Casey et al. | 257/723 |

FOREIGN PATENT DOCUMENTS

JP 9-135565 5/1997

* cited by examiner

*Primary Examiner*—Nathan W Ha
(74) *Attorney, Agent, or Firm*—Brundidge & Stanger, P.C.

(57) ABSTRACT

A semiconductor device formed by using semiconductor packages is provided. The semiconductor device includes two semiconductor packages adjacently arranged in opposite directions on an inductive conductor. Terminals of the two semiconductor packages are joined by a third lead. the third lead is arranged substantially in parallel to the inductive conductor. Leads at the joint portions have, for example, a bent structure, and the third lead is arranged to be close to the inductive conductor.

12 Claims, 15 Drawing Sheets

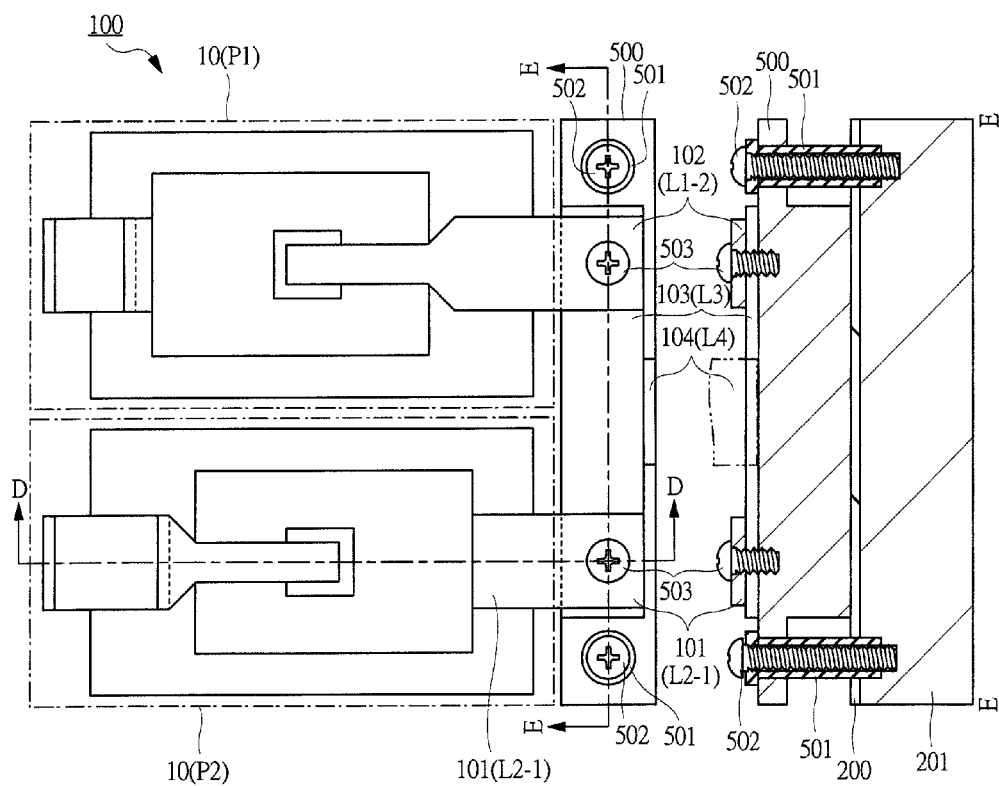
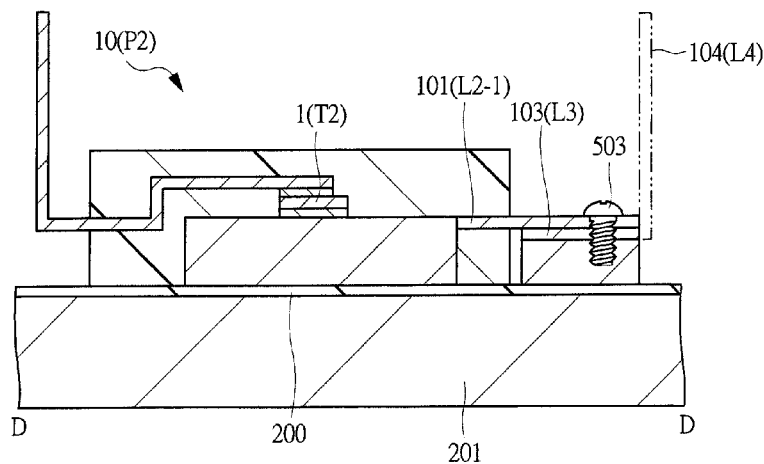

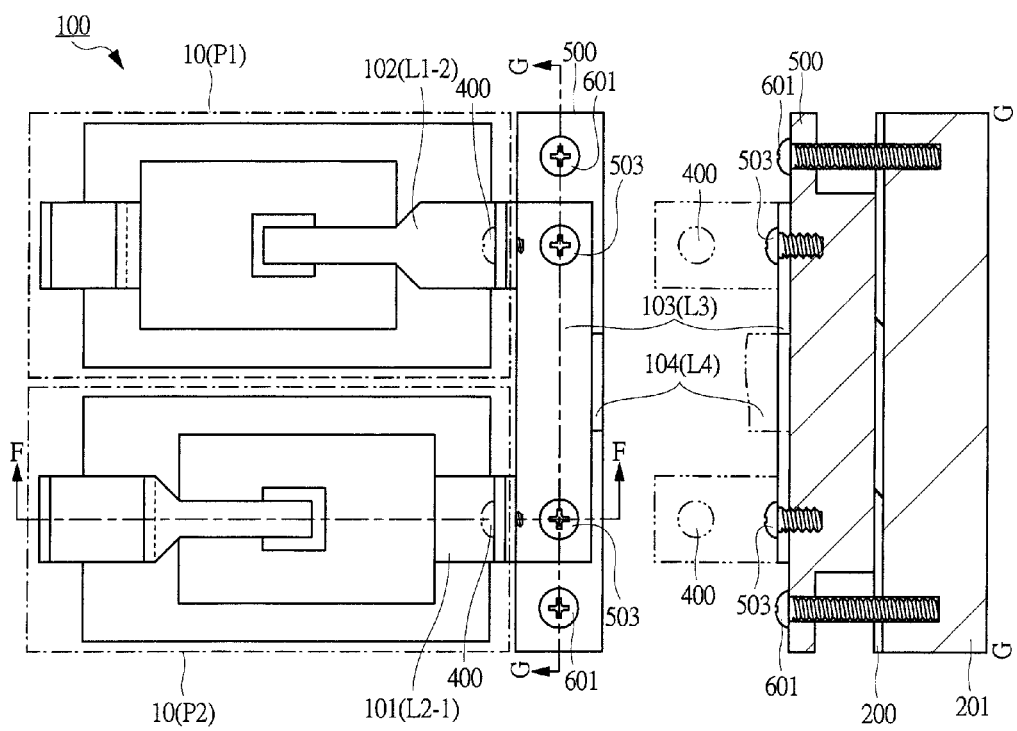
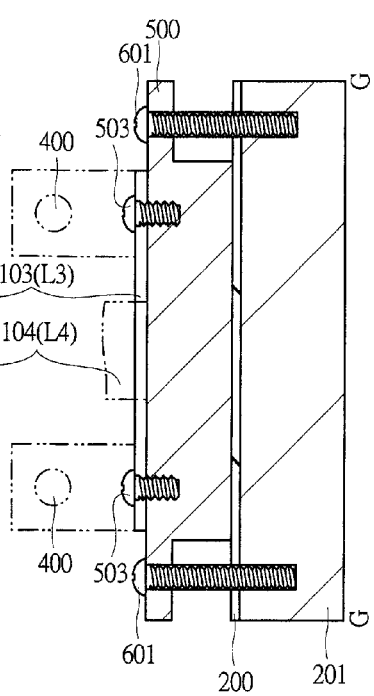
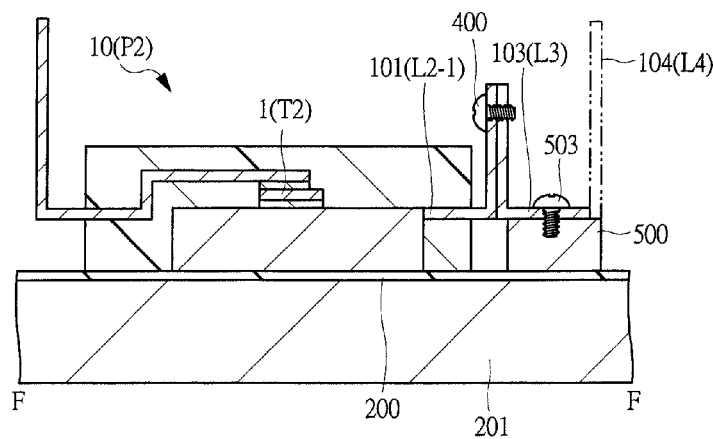
FIG. 9A
FIG. 9C
FIG. 9B

SEMICONDUCTOR DEVICE

CROSS-REFERENCE TO RELATED APPLICATION

The present application claims priority from Japanese Patent Application No. 2009-140454 filed on Jun. 11, 2009, the content of which is hereby incorporated by reference into this application.

TECHNICAL FIELD OF THE INVENTION

The present invention relates to a technology of a semiconductor device (semiconductor package, semiconductor switching device, etc.) used in a power conversion device etc. More particularly, the present invention relates to a technology for reducing inductance.

BACKGROUND OF THE INVENTION

For conventional semiconductor devices used in a power conversion device etc., there are technologies for reducing inductance using an induced current.

One of known conventional power conversion device is described in, for example, Japanese Patent Application Laid-Open Publication No. H09-135565 (Patent Document 1), the power conversion device having an inductive conductor in which an induced current flows in parallel to a wiring conductor so that an inductance of the wiring conductor is reduced.

SUMMARY OF THE INVENTION

However, in the conventional technologies, their inductance reduction effects are insufficient. In the technology of Patent Document 1, an induced current is not induced because a joint portion of an output terminal is away from the inductive conductor, and thus it is difficult to obtain an inductance reduction effect. Also, to obtain a high inductance reduction effect, it is necessary to arrange a wiring conductor so that the induced current is closed in a circular form, but since a supply terminal (positive) and a supply terminal (negative) are away from each other, it is difficult to close the induced current, and thus it is difficult to obtain an inductance reduction effect.

A main preferred aim of the present invention relates to a technology of a semiconductor device (semiconductor package etc.) used in a power conversion device etc. and is a technology capable of reducing inductance, and reducing surge voltage, switching loss, and/or electromagnetic radiation noise.

A typical one of the inventions disclosed in the present application will be briefly described as follows. A typical embodiment of the present invention is a technology of a semiconductor device (semiconductor package etc.) used in a power conversion device etc. having the following construction.

In the semiconductor device according to the embodiment, a current, which flows from an input terminal (positive supply terminal) to an output terminal (negative supply terminal) via an external output terminal, is closed in a circular form, and moreover, an inductance is reduced by making the current to be induced in an inductive conductor, thereby reducing surge voltage, switching loss, and/or electromagnetic radiation noise.

(1) A semiconductor device according to the present embodiment includes, for example, two semiconductor packages. The two semiconductor packages are connected to a plane of an inductive conductor.

The semiconductor package includes: a heat spreader; a semiconductor element having a first electrode surface electrically connected onto the heat spreader; a first lead electrically connected to the heat spreader (that is, electrically connected to the semiconductor element via the heat spreader) and having a part (terminal) exposed to the outside; a second lead electrically connected to a second electrode surface of the semiconductor element and having a part (terminal) exposed to the outside; and a mold material for resin-molding the heat spreader, the semiconductor element, the part of the first lead (side connected to the semiconductor element), and the part of the second lead (side connected to the heat spreader).

The semiconductor device includes, as two semiconductor packages: a first semiconductor package arranged on a plane of an inductive conductor and in a first direction; and a second semiconductor package arranged adjacent to the first semiconductor package and in a direction opposite to the first direction of the first semiconductor package. Further, the semiconductor device has the plane of the inductive conductor at lower sides of the heat spreaders of the first and second semiconductor packages via the insulating member.

In the semiconductor device, for example, the first lead of the first semiconductor package is an input terminal (positive supply terminal), and the second lead of the second semiconductor package is an output terminal (negative supply terminal). And, the semiconductor device further includes a third lead which electrically connects (joints) the second lead of the first semiconductor package and the first lead of the second semiconductor package.

According to the above construction, an inductance of a circuit (switching element) formed of, for example, two semiconductor packages is reduced, thereby reducing a surge voltage and loss or noise.

(2) In the semiconductor device according to the present embodiment, the third lead is arranged to be substantially parallel to the inductive conductor (its plane), and the third lead is arranged at a height near the insulating member. Also, an external output terminal is provided on the third lead, or on a fourth lead extended in any direction from the third lead as a continuous member or the like. By shortening a distance between the third lead and the inductive conductor, it is easier to generate induction to the inductive conductor.

(3) In the semiconductor device according to the present embodiment, particularly, the first lead and the second lead on the joint side and the third lead (moreover, the fourth lead) are integrally formed by one lead frame. Alternatively, the third lead (moreover, the fourth lead) may be formed of a different conductor than that of the first lead and the second lead.

Also, more specifically, at the joint of the first and second leads and the third lead (moreover, the fourth lead), a lead frame is formed in a shape being bended towards the inductive conductor (bent structure), so that a distance between the third lead and the inductive conductor is shortened.

(4) The semiconductor device according to the present embodiment includes, more specifically, a block (conductor) electrically connected to the first lead (end portion thereof) and the second lead (end portion thereof) on the joint side and arranged on the insulating member (inductive conductor). A size of the block has a length for continuously and electrically connecting the first lead (end portion thereof) and the second lead (end portion thereof), and a thickness for reaching the insulating member (inductive conductor). For example, the block is electrically connected to and arranged at a lower portion of the third lead.

(5) The semiconductor device includes, more specifically, an inductive conductor protruding portion of a part of the inductive conductor at a portion of the inductive conductor facing the third lead, the inductive conductor protruding portion protruding (bulging) in a direction to be closer to the third lead (in a direction perpendicular to the plane of the inductive conductor).

(6) In the semiconductor device according to the present embodiment, more specifically, the inductive conductor has a role of a heat-dissipation fin. In other words, the semiconductor device is formed at a part of a device chassis having a function of a heat-dissipation fin.

The effects obtained by typical aspects of the present invention will be briefly described below. The typical embodiment of the present invention relates to a technology of a semiconductor device (semiconductor package etc.) used in a power conversion device etc., and reduces inductance, thereby reducing surge voltage, switching loss, and/or electromagnetic radiation noise.

BRIEF DESCRIPTIONS OF THE DRAWINGS

FIG. 8A is an upper plan view illustrating a structure of a semiconductor device according to a fifth embodiment of the present invention;

FIG. 8B is a D-D cross-sectional view illustrating a structure of the semiconductor device according to the fifth embodiment;

FIG. 8C is an E-E cross-sectional view illustrating a structure of the semiconductor device according to the fifth embodiment;

FIG. 9A is an upper plan view illustrating a structure of a semiconductor device according to a sixth embodiment of the present invention;

FIG. 9B is an F-F cross-sectional view illustrating a structure of the semiconductor device according to the sixth embodiment;

FIG. 9C is a G-G cross sectional view illustrating a structure of the semiconductor device according to the sixth embodiment;

DESCRIPTIONS OF THE PREFERRED EMBODIMENTS

Hereinafter, embodiments (semiconductor device, power conversion device, etc.) of the present invention will be described in detail with reference to the accompanying drawings (FIGS. 1 to 15). Note that components having the same function are denoted by the same reference symbols throughout the drawings for describing the embodiment, and the repetitive description thereof will be omitted.

First Embodiment

Figure 1:
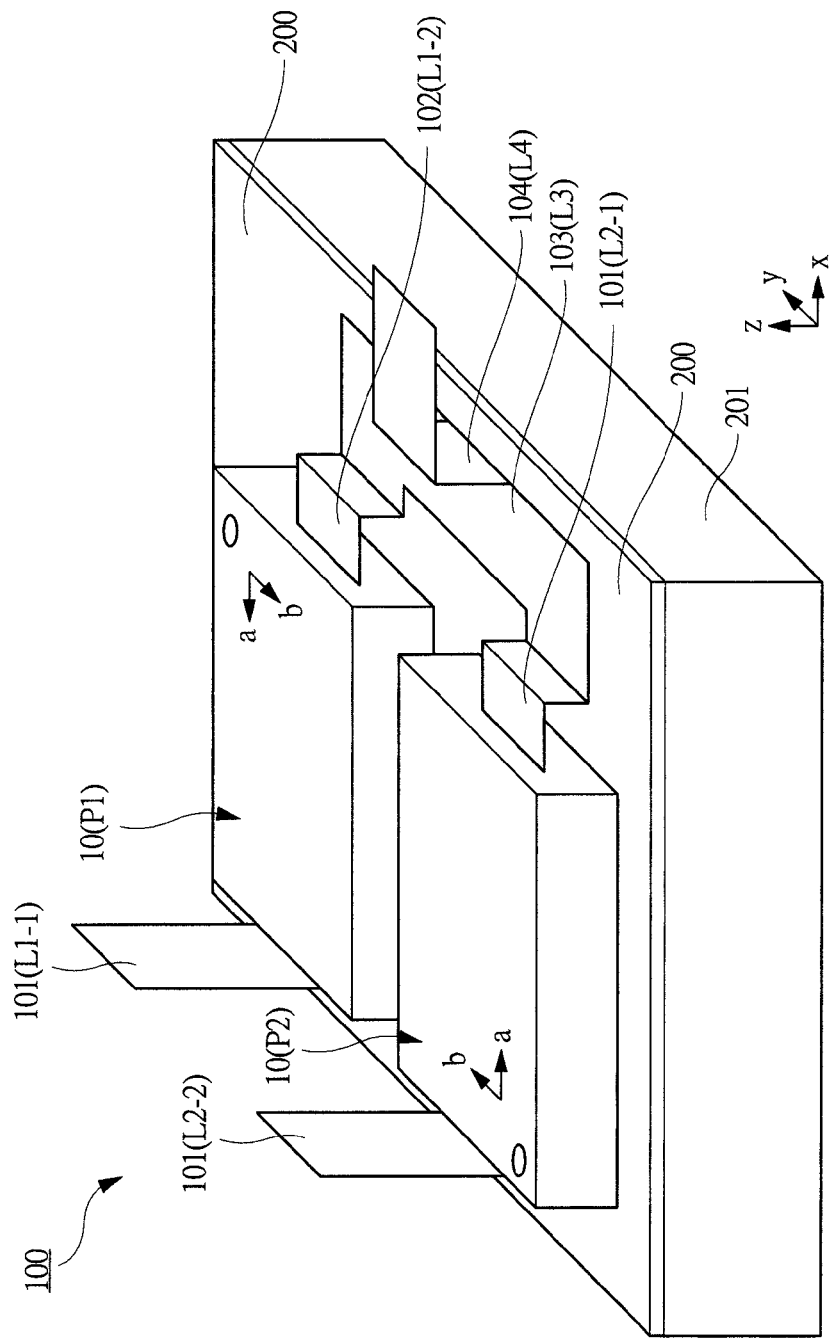
FIG. 1 is a perspective view illustrating a schematic structure of a semiconductor device according to a first embodiment of the present invention.

With reference to FIGS. 1 to 4, a semiconductor device (power conversion device etc.) according to a first embodiment of the present invention will be described. As a summary, the first embodiment has a structure in which two semiconductor packages 10 (P1, P2) are adjacently arranged in opposite directions on an inductive conductor 201 as illustrated in FIG. 1 etc., and one lead of one of the semiconductor packages 10 and one lead of the other semiconductor package 10 (102, 101) are joined by a third lead 103 being arranged close to the inductive conductor 201.

FIG. 1 illustrates a schematic structure of the semiconductor device according to the first embodiment in a perspective manner (3D space in (x, y, z) directions). A semiconductor device 100 according to the present embodiment includes: a first semiconductor package 10 (P1); a second semiconductor package 10 (P2); a third lead 103 (L3); and a fourth lead 104 (L4). Each of the semiconductor packages 10 (P1, P2) includes a first lead 101 (L1-1, L2-1), and a second lead 102 (L1-2, L2-2). The whole structure including the semiconductor device 100 is, for example, a power conversion device (described later).

The semiconductor device 100 includes the two semiconductor packages 10 (P1, P2) mounted and arranged on a plane (x-y) of the inductive conductor 201 via an insulating member. The two semiconductor packages 10 (P1, P2) have the same structure except for their directions of arrangement and connection portions, etc. The two semiconductor packages 10 (P1, P2) are arranged in opposite directions having their side surfaces adjacent to each other on the plane (x-y) of the inductive conductor 201. That is, the first semiconductor package 10 (P1) is arranged in a direction illustrated by the arrow "a" (side surface to which the first lead 101 (L1-1) is provided) of one direction (left side) of the x direction when viewed in P1 unit. Oppositely, the second semiconductor package 10 (P2) is arranged in a direction of P1 turned by 180° in plane, that is, in a direction illustrated by the arrow "a" (side surface to which the first lead 101 (L2-1) is provided) of the other direction (right side) of the x direction when viewed in P2 unit. A side surface of the P1 unit illustrated by the arrow "b" and a side surface of the P2 unit illustrated by the arrow "b" face adjacent to each other.

The first lead L1-1 of P1 and the first lead L2-1 of P2 basically have the same structure (same first lead 101), but L1-1 of P1 is an input terminal (positive supply terminal) lead to the outside, and L2-1 of P2 is connected to the third lead 103 (L3). Similarly, as to the same second lead 102, L1-2 of P1 is connected to the third lead 103 (L3), and L2-2 of P2 is an output terminal (negative supply terminal) lead to the outside. When viewed as a whole of the semiconductor device 100, L1-1 of P1 is a positive supply terminal, and L2-2 of P2 is a negative supply terminal as input and output terminals.

The second lead 102 (L1-2) of the first semiconductor package 10 (P1) and the first lead 101 (L2-1) of the second semiconductor package 10 (P2) are electrically connected by the third lead 103 (L3) to be a joint portion. The fourth lead 104 (L4) is extendedly provided as a continuous member, for example, from the center to the outside of the third lead 103 (L3). The third lead 103 (L3) is arranged to be close to the inductive conductor 201 in a direction (z direction) perpendicular to the plane (x-y).

Figure 2:
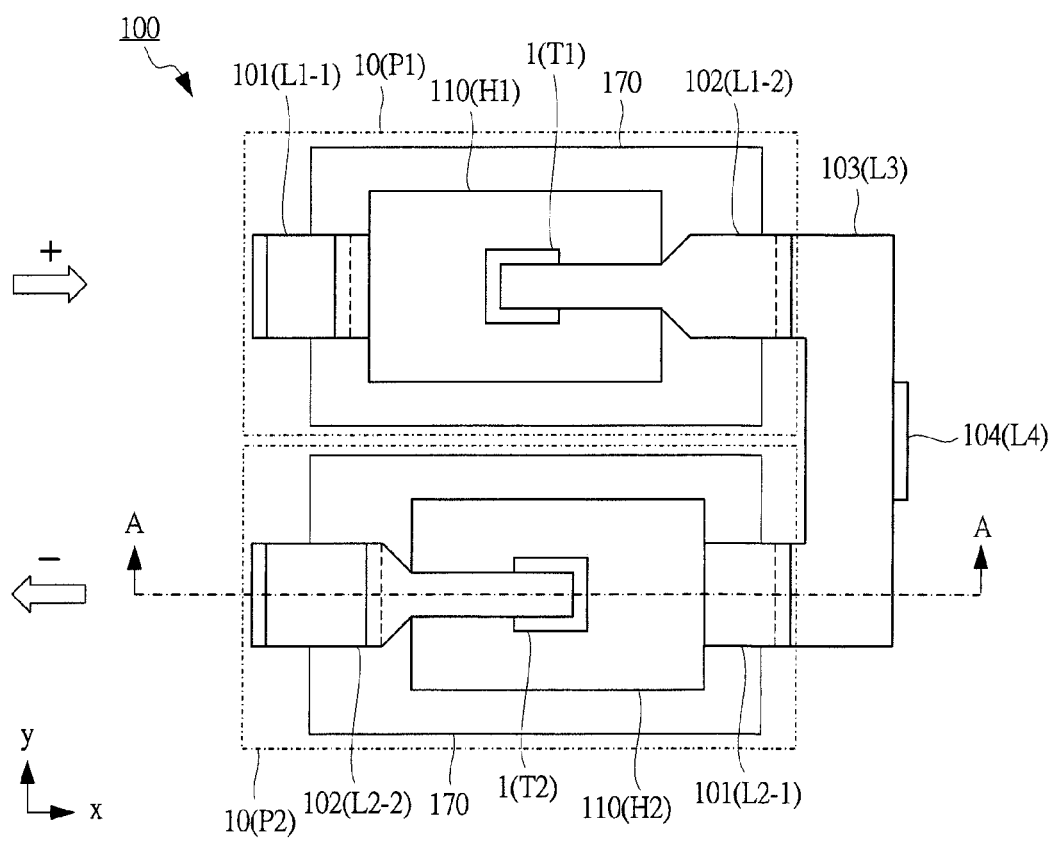
FIG. 2 is an upper plan view illustrating a structure of the semiconductor device according to the first embodiment.

In FIG. 2, an upper-plane (x-y) structure is illustrated to describe a structure and operation of the first semiconductor device 10 of the first embodiment. The semiconductor package 10 (P1, P2) includes: a heat spreader 110 (H1, H2); a semiconductor element 1 (T1, T2); a first lead 101 (L1-1, L2-1); a second lead 102 (L1-2, L2-2); and a mold material 170 for resin-molding the above components.

The heat spreader 110 (H1, H2) is a thick plate metal (a heat-dissipation member, and also, a conductor). The semiconductor element 1 (T1, T2) is an IC chip. The first lead 101 (L1-1, L2-1) and the second lead (L1-2, L2-2) are conductors to be terminal portions of the semiconductor package 10 (P1, P2). The third lead 103 (L3) and the fourth lead 104 (L4) are conductors, similarly to the first lead 101 and the second lead 102. The third lead 103 (L3) is a joint potion between P1 (L1-2) and P2 (L2-1). The fourth lead 104 (L4) itself or one end portion thereof is an output terminal to the outside of the semiconductor device 100 (or a portion to which the external output terminal is provided).

In the first embodiment, on the side of the joint of the two semiconductor packages 10 (P1, P2), each lead (lead frame), that is, each of L2-1 of P2, L1-2 of P1, L3, and L4 is a module formed as one member (conductor) by a continuous member.

Figure 3:
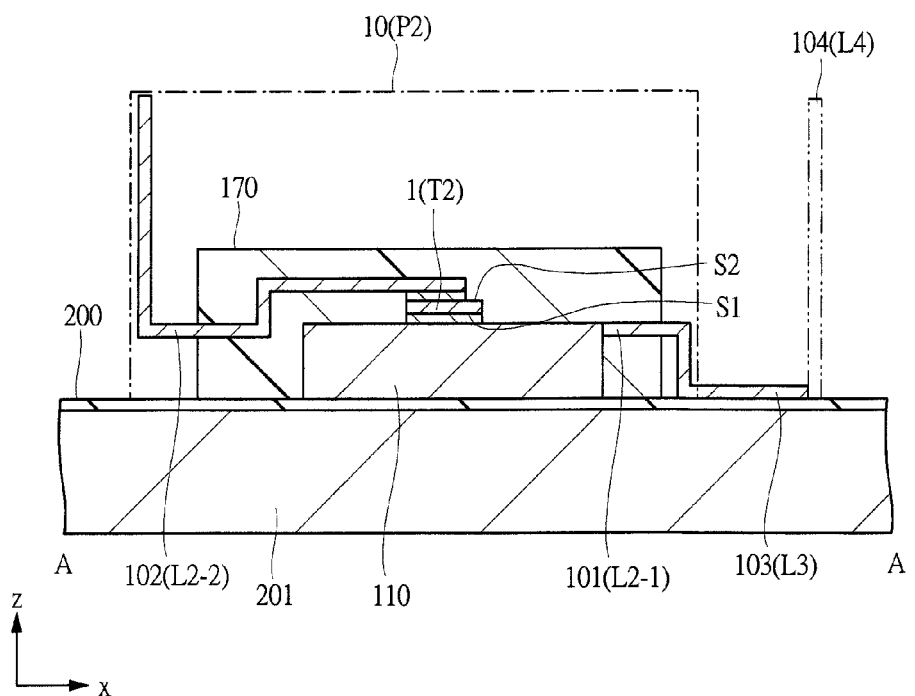
FIG. 3 is a diagram illustrating an A-A cross section of the semiconductor device in FIG. 2 according to the first embodiment.

In FIG. 3, an A-A, cross-sectional (x-z) structure on the side of the second semiconductor package 10 (P2) in the semiconductor device 100 in FIG. 2 is illustrated as an example. The semiconductor package 10 (P1, P2) is a resin-molded package in which the heat spreader 110 (H1, H2), the semiconductor element 1 (T1, T2), a part of the first lead 101 (L1-1, L2-1) (internal connection side), and a part of the second lead 102 (L1-2, L2-2) (internal connection side) are covered by the mold material 170.

The two semiconductor packages 10 (P1, P2) are mounted on the inductive conductor 201 via the insulating member 200 under a heat-dissipation surface (lower surface) of the heat spreader 110 (H1, H2). A first electrode surface S1 (lower surface side in FIG. 3) of the semiconductor element 1 (T2) is electrically connected to the heat spreader 110 (H2) (upper surface) via a connection layer. The first lead 101 (L2-1) is electrically connected to the heat spreader 110 (H2) and a part of the first lead 101 (L2-1) is exposed to the outside from the mold material 170. A second electrode surface S2 of the semiconductor device 1 (T2) (upper surface side in FIG. 3) is electrically connected to the second lead 102 (L2-2 regarding T2) via a connection layer.

In the first embodiment, the third lead 103 (L3) (its lower-side plane) is arranged to be substantially parallel to the inductive conductor 201 plane (x-y) and also arranged to be in contact with (abutting) the insulating member 200. On the joint side of the two semiconductor packages (P1, P2), that is, near the connections of the leads (L2-1, L1-2) and L3, the structure is made such that the lead is bent for the abutting (bent structure). More specifically, the second lead 102 (L1-2) of P1 and the first lead 101 (L2-1) of P2 are bent from the x direction to the downside of the z direction (direction toward the inductive conductor 201) and connected to the third lead L3.

On the input and output terminal sides, that is, the first lead 101 (L1-1) of P1 and the second lead 102 (L2-2) of P2 are bent, for example, from the x direction to the upside of the z direction. The fourth lead 104 (L4) is extended toward the upside of the z direction, and further, as illustrated in FIG. 1, the fourth lead 104 (L4) is bent in the x direction. Such a shape is just one example, and it is suitably designed in accordance with a connection relationship to the outside.

The inductive conductor 201 is apart of a chassis of the power conversion device, for example. The chassis is made of, for example, aluminum, and has a function of heat-dissipation fin. A part of the chassis having a function of heat-dissipation fin is used as the inductive conductor 201.

Figure 4:
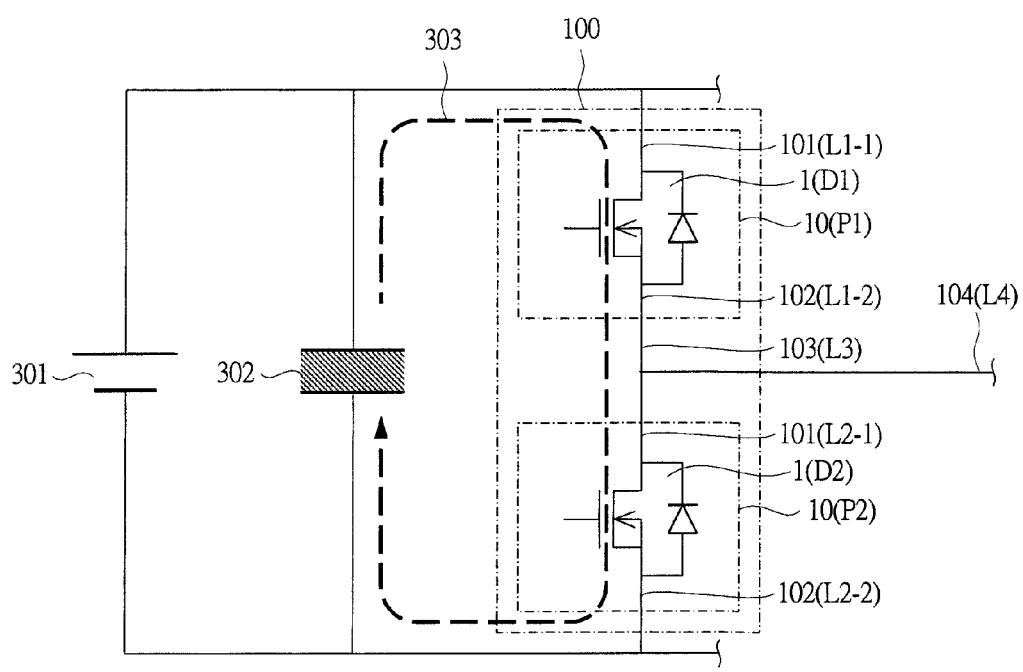
FIG. 4 is a diagram illustrating a circuit of a part of a power conversion device formed with using the semiconductor device according to the first embodiment.

FIG. 4 illustrates a circuit configuration of a part of the power conversion device structured with using the semiconductor device 100. The two semiconductor elements 1 (semiconductor packages 10) are paired as one pair, so that single-phase switching circuit (switching element) is configured. Note that, further, a multiple-phase switching device can be configured by using a plurality of the semiconductor devices 10 (switching device).

The first lead 100 (L1-1) of P1 is an input terminal (positive supply terminal) in a closed loop (303) for a current to flow. The second lead 102 (L2-2) of P2 is an output terminal (negative supply terminal) in the closed loop (303).

The second lead 102 (L1-2) on the output (source) side of the first semiconductor element T1 (package P1) and the first lead 101 (L2-1) on the input (drain) side of the second semiconductor element T2 (package P2) are connected by the third lead 103 (L3).

In addition, in view of the physical structure, the first lead L1-1 (input side of the closed loop) on the input (drain) side of the first semiconductor element T1 (P1) and the second lead L2-2 (output side of the closed loop) on the output (source) side of the second semiconductor element T2 (P2) are arranged to be adjacent to each other (FIG. 2).

A smoothing capacitor 302 stores power applied from a power supply 301, and applies power to the semiconductor device 100. A current in a pulse shape flows in the semiconductor device 100 by a switching operation of a switching element by the two semiconductor elements (T1, T2). Each semiconductor element 1 has an abrupt current change (di/dt) upon switching on and off. Since a wiring, in which a current flows, has an inductance L, a surge voltage expressed by (Ldi/dt) is applied to the semiconductor element 1 upon switching, and a switching loss is increased as well. Since the inductance L caused by the surge voltage is determined by a wiring inductance L of the closed loop 303, it is necessary to lower the inductance L of the closed loop 303 to suppress the surge voltage.

The area of the semiconductor device 100, in which the current of the closed loop 303 flows, includes the first lead 101 (L1-1) (input terminal) of the first semiconductor package 10 (P1), the second lead 102 (L1-2) of P1, the third lead 103 (L3), the first lead L2-1 of the second semiconductor package P2, and the second lead (L2-2) (output terminal) of P2 in the order of the paths.

In the first embodiment, in the paths of the closed loop 303, the third lead 103 (L3) is contacted with the insulating member 200 (i.e., close to the inductive conductor 201) so that it is easy to induce an induced current to the inductive conductor 201, thereby reducing the inductance.

Further, the first lead 101 (L1-1) (input terminal, positive supply terminal) of the first semiconductor package 10 (P1) and the second lead 102 (L2-2) (output terminal, negative supply terminal) of the second semiconductor package 10 (P2) to be the input and output terminals (supply terminal) of the closed loop 303 are arranged as the arrangement of the packages adjacent to each other illustrated in FIG. 4 so that it is easy for the induced current to flow in a circular shape. In this manner, an inductance reduction efficiency can be improved.

As described above, according to the first embodiment, the surge voltage and switching loss applied to the switching element of the semiconductor package 10 can be reduced, fluctuations of voltage and/or current are suppressed so that noise is reduced, and thus electromagnetic radiation noise can be reduced.

More specifically, since a current in a pulse shape flows in the semiconductor package 10 and the output terminal, an induced current flows in the inductive conductor 201. Since the direction of the induced current is opposite to that of the current in a pulse shape, a magnetic field in an opposite direction to a magnetic field generated by the current in a pulse shape is generated. Thus, since the induced current has a role of weakening the magnetic field formed by the current in a pulse shape, an effect of reducing the inductance can be obtained.

In addition, according to the bent structure in which the output terminal is bent, stress on the semiconductor package 10 and the output terminal are mitigated, so that damages applied by repeated stress are reduced.

Further, since the output terminal is previously joined, an effect of reducing the number of steps for connections upon mounting the semiconductor device 100 (semiconductor package 10) can be obtained.

Note that, as a modification example, the plurality of leads on the joint side may be divided into a plurality of sections. For example, L2-1 and L1-2 may be different and separated members from L3, and L2-1 and L1-2 and L3 may be electrically connected (third embodiment described later). Further, L3 and L4 may be different and separated members, and L3 and L4 may be electrically connected.

While the configuration described above has two packages (P1, P2) in which two semiconductor elements 1 (T1, T2) are individually sealed by the mold material 170, an aspect of sealing the whole of a part including the two semiconductor elements 1 (T1, T2) into one package by the one mold material 170 is also possible.

While the configuration described above has the third lead 103 (L3) being provided outside the package (mold material 170), both a configuration in which L3 is included in the package (mold material 170) and a configuration in which L3 is not included in the package (mold material 170) are possible.

In the above-described configuration, an aspect in which the leads (L1-1 and L2-2) to be input and output terminals are positioned to be closer to each other (a design to arrange the leads to be closer to the package side surface (b direction)) is also possible.

Moreover, while the bent structure is used to the lead (near L3) at the joint portion in the above-described configuration, a configuration in which the lead is not bent in accordance with mounting details can be also used. Also in that case, as long as the distance between L3 and the inductive conductor 201 is sufficiently close, the inductance reduction effect can be accordingly obtained corresponding to the distance.

Second Embodiment

Figure 5:
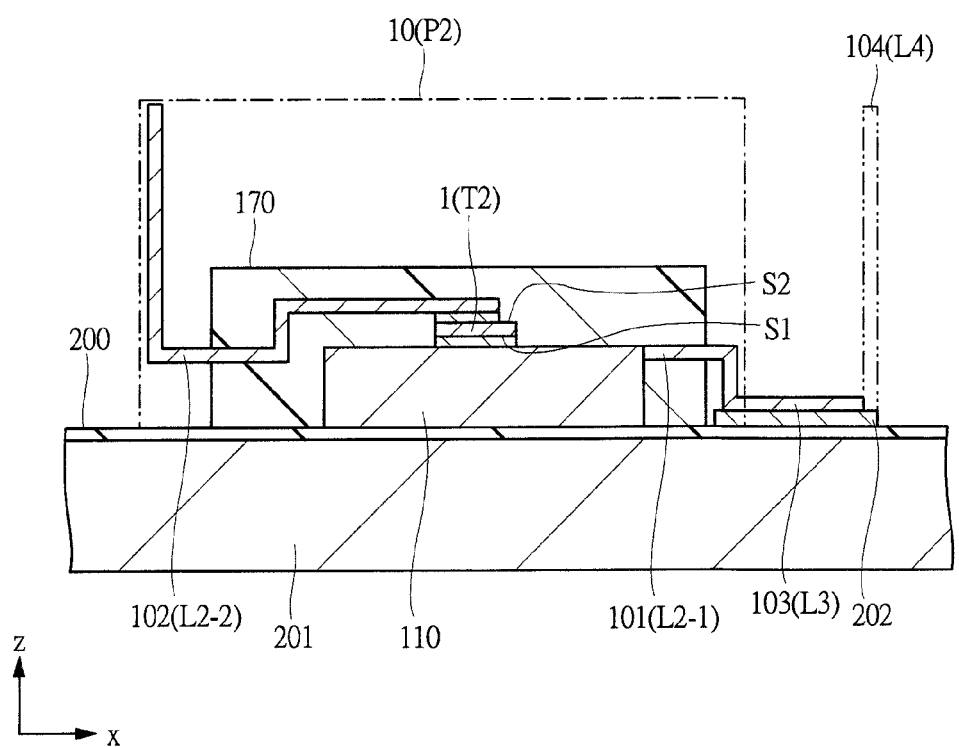
FIG. 5 is a cross-sectional view illustrating a structure of a semiconductor device according to a second embodiment of the present invention.

Next, with reference to FIG. 5, a semiconductor device 100 according to a second embodiment will be described. FIG. 5 illustrates a cross section of the semiconductor device 100 (for example, a cross section of a second semiconductor package 10 (P2)) according to the second embodiment. A description of an upper plane structure will be omitted as the structure is the same with that in FIG. 2.

In the second embodiment (FIG. 5), a different point from the first embodiment described above is that a second insulating member 202 is sandwiched between the third lead 103 (L3) and the insulating member 200. The second insulating member 202 prevents, when external force is applied to the third lead 103 (L3), L3 from destroying the (first) insulating member 200 or contacting the inductive conductor 201. In this manner, a mounting reliability is improved.

In the second embodiment, an induced current can be induced to the inductive conductor 201 when the distance from the third lead 103 (L3) and the inductive conductor 201 is sufficiently small, and thus the inductance can be reduced. Also, similarly to the first embodiment described above, the input/output portions (L1-1 of P1, L2-2 of P2) of the closed loop 303 are adjacently arranged so that it is easy for the induced current to flow in a circular shape, the inductance reduction efficiency can be improved.

Also, instead of providing the second insulating member 202 described above, it is possible to use a configuration in which the distance (z direction) between the third lead 103 (L3) and the (first) insulating member 200 is increased by a thickness of the second insulating member 202 in FIG. 5.

Third Embodiment

Figure 6A:
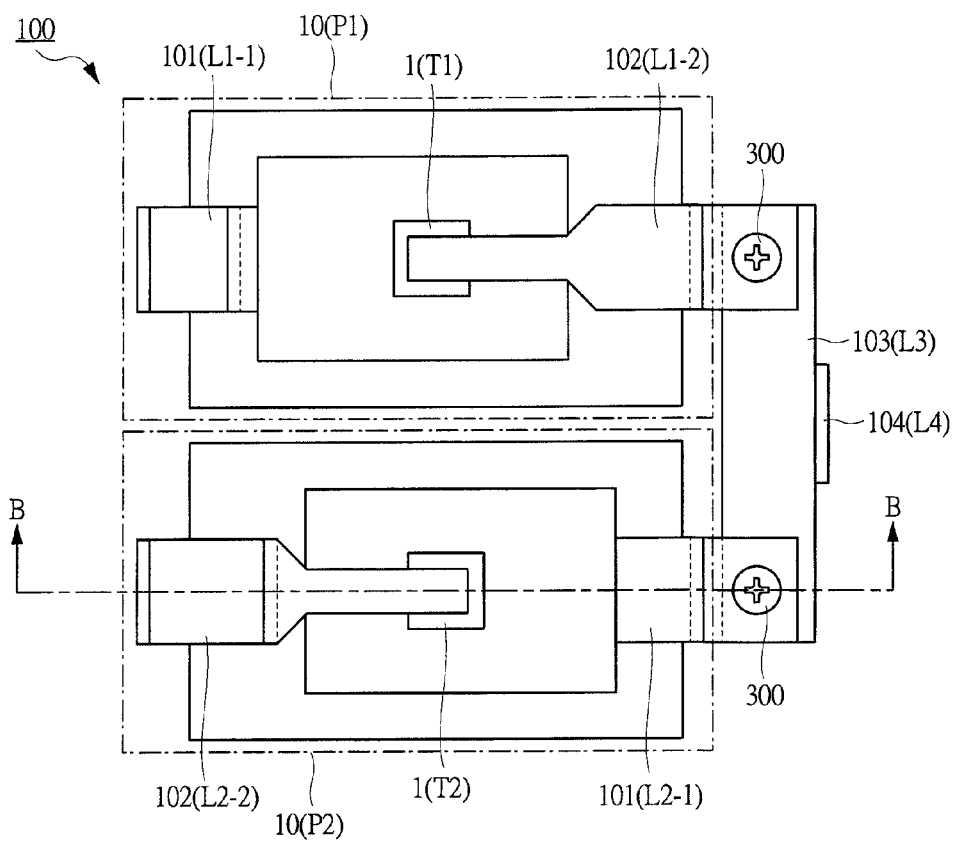
FIG. 6A is an upper plan view illustrating a structure of a semiconductor device according to a third embodiment of the present invention.
Figure 6B:
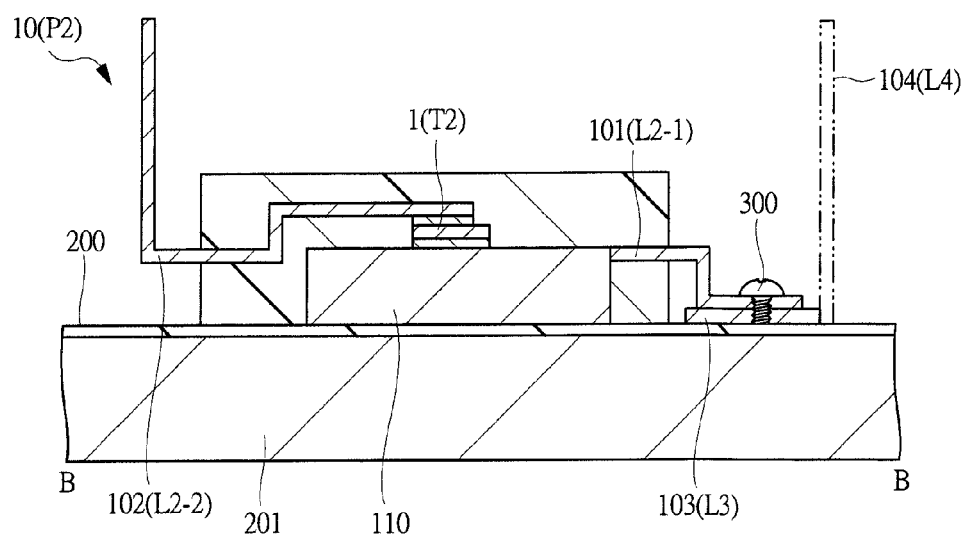
FIG. 6B is a B-B cross-sectional view illustrating a structure of the semiconductor device according to the third embodiment.

Next, with reference t FIGS. 6A and 6B, a semiconductor device according to a third embodiment will be described. FIG. 6A illustrates an upper plane structure of the semiconductor device according to the third embodiment, and FIG. 6B illustrates a B-B (P2) cross section of the same.

A different point of the third embodiment (FIGS. 6A and 6B) from the above-described embodiments is that the third lead 103 (L3) is formed of a different conductor than that of the second lead 102 (L1-2) of the first semiconductor package 10 (P1) and the first lead 101 (L2-1) of the second semiconductor package 10 (P2).

The third lead 103 (L3) is structured to be joined to L1-2 of P1 and L2-1 of P2 by a joint member 300 such as a rivet. Note that each of L1-2 of P1 and L2-1 of P2 has an extended portion overlapping the plane of L3.

According to the above configuration, similarly to the embodiments described above, the third lead 103 (L3) is contacted with the insulating member 200 so that the induced current is easy to be induced to the inductive conductor, and thus the inductance can be reduced. Also, similarly to the embodiments described above, by adjacently arranging the input/output portions (L1-1, L2-2) of the closed loop 303, the inductance reduction efficiency can be improved. Note that, similarly to the second embodiment, the third insulating member 202 can be provided between L3 and the insulating member 200.

Fourth Embodiment

Figure 7A:
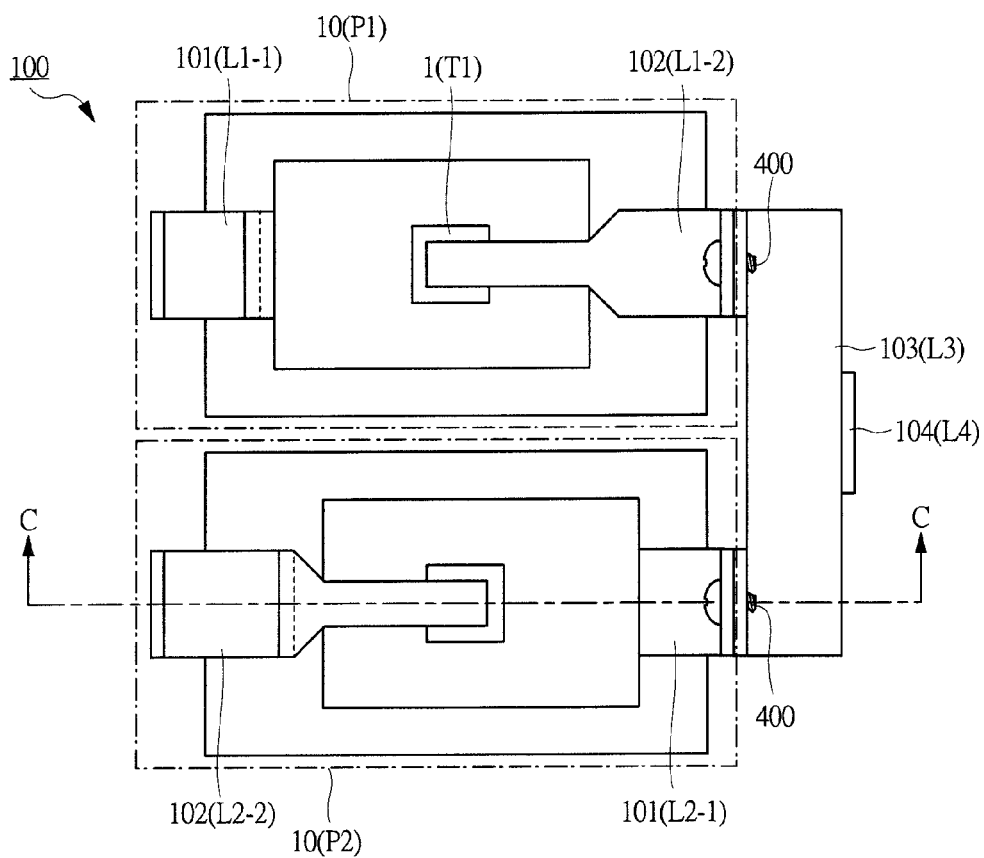
FIG. 7A is an upper plan view illustrating a structure of a semiconductor device according to a fourth embodiment of the present invention.
Figure 7B:
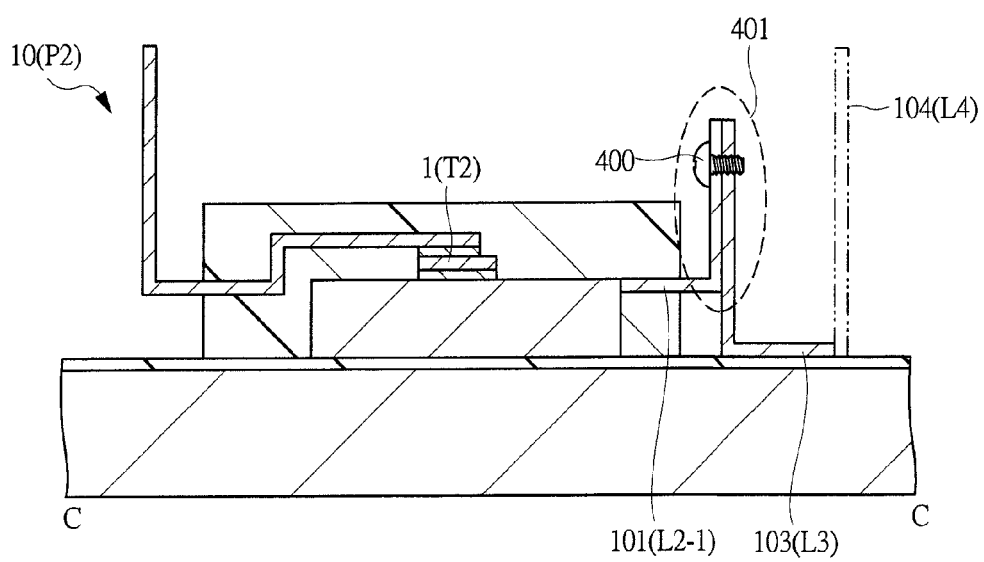
FIG. 7B is a C-C cross-sectional view illustrating a structure of the semiconductor device according to the fourth embodiment

Next, with reference to FIGS. 7A and 7B, a semiconductor device 100 according to a fourth embodiment will be described. FIG. 7A illustrates an upper plane structure of the semiconductor device 100 according to the fourth embodiment, and FIG. 7B illustrates a C-C (P2) cross section of the same.

In the fourth embodiment (FIGS. 7A and 7B), a different point from the embodiments described above is that the second lead 102 (L1-2) of the first semiconductor package 10 (P1) and the first lead 101 (L2-1) of the second semiconductor package 10 (P2) are bent to a direction opposite to the inductive conductor 201 (toward upside of the z direction), and in addition, the leads are joined with the third lead 103 (L3) by a joint member 400 such as a rivet.

In the fourth embodiment, on the joint side (L1-2, L2-1, L3), each of L1-2 and L2-1 has a plane contact portion 401 adjacent to the third lead 103 (L3). In the plane contact portion 401, directions of currents flowing in L1-2 of P1 and L2-1 of P2 are opposite to that of a current flowing in L3. Thus, an inductance increase is suppressed. In addition, similarly to the embodiments described above, since L3 is contacted with the insulating member 200 so that the induced current is easily induced to the inductive conductor 201, the inductance can be reduced, and since the input/output portions of the closed loop 303 are adjacently arranged, the inductance reduction efficiency can be improved. Note that the second insulating member 202 may be sandwiched between L3 and the insulating member 200.

Fifth Embodiment

Next, with reference to FIGS. 8A to 8C, a semiconductor device 100 according to a fifth embodiment will be described. FIG. 8A illustrates an upper plane structure of the semiconductor device 100 according to the fifth embodiment, FIG. 8B illustrates a D-D (P2) cross section of the same, and FIG. 8C illustrates an E-E cross section of the same.

In the fifth embodiment (FIGS. 8A-8C), a different point from the embodiments described above is that a part corresponding to the third lead 103 (L3) is formed by using a metal block 500. The metal block 500 is mounted on the inductive conductor 201 via the insulating member 200.

Particularly, in the present embodiment, to a lower side of L2 in a plate shape, the metal block 500 in a substantially rectangular shape is arranged. Dimensions of the metal block 500 are: a y-direction length capable of continuously connecting the end portion of the second lead (L1-2) of P1 and the end portion of the first lead (L2-1) of P2 at least; an x-direction length being larger than or equal to a width of L3; and a thickness (z-direction length) of a distance from L3 to the insulating member 200. In addition, with using a pair of screws 503 inside, the end portion of L1-2 and the end portion of L2-1 are fixed (electrically connected) to an upper surface of the metal block 500 together with the third lead 103 (L3).

Further, as well as the metal block 500 is fixed to the inductive conductor 201 side by a pair of screws 502 outside, a portion of the metal block 500 facing the insulating member 200 is hollowed corresponding to the positions of the screws 502. The screw 502 has a structure covered with an insulating collar 501. To the inductive conductor 201, holes for burying the insulating collar 501 and screw holes for the screws 502 are provided.

A high-frequency component in accordance with a switching operation of the present device flows in a surface of the metal block 500, so that it is easy to induce the induced current to the inductive conductor 201, and thus the inductance can be reduced. And also, in the same manner as that of the above-described embodiments, since the input/output portions of the closed loop 303 are adjacently arranged, the inductance reduction efficiency can be improved.

Also, according to the fixation structure of the metal block 500 by the screws 502 and the insulation collars 501 and the hollow structure of the metal block 500, a creepage distance of the inductive conductor 201 and the metal block 500 is ensured, thereby improving an insulation reliability.

Note that, in the present embodiment, L1-2 and L2-1 on the joint side have a shape straightly extended in accordance with a height of L3 or/and the metal block 500 instead of a bended shape.

Sixth Embodiment

Next, with reference to FIGS. 9A to 9C, a semiconductor device according to a fifth embodiment will be described. FIG. 9A illustrates an upper plane structure of the semiconductor device 100 according to the sixth embodiment, FIG. 9B is an F-F (P2) cross section of the same, and FIG. 9C illustrates a G-G cross section of the same.

In the sixth embodiment (FIGS. 9A to 9C), a different point from the embodiments described above is that end portions of the second lead 102 (L1-2) of P1 and the first lead 101 (L2-1) of P2 and both end portions of the third lead 103 (L3) corresponding to L1-2 and L2-1 are bent in a direction (upside of the z direction) opposite to the inductive conductor 201, and also joined to each other by the joint member 400 (similarly to the fourth embodiment), and the third lead 103 (L3) is connected to the metal block 500 (similarly to the fifth embodiment).

In the present structure, in addition to an induction lowering in the same manner as the embodiments described above, it is possible to provide a margin (allowance) upon joining (coupling) by the joint member 400 (allowing a minute shift in upward and downward the z direction), thereby connecting the leads (L1-2, L2-1, L3) to each other without leaving excessive residual stress to L1-2 of P1 and L2-1 of P2.

Moreover, in the present embodiment, an insulating screw 601 is particularly used for fixing the metal block 500. In this manner, without using the insulation collar 501 of FIGS. 8A to 8C described above, it is possible to obtain an insulation reliability.

Seventh Embodiment

Figure 10A:
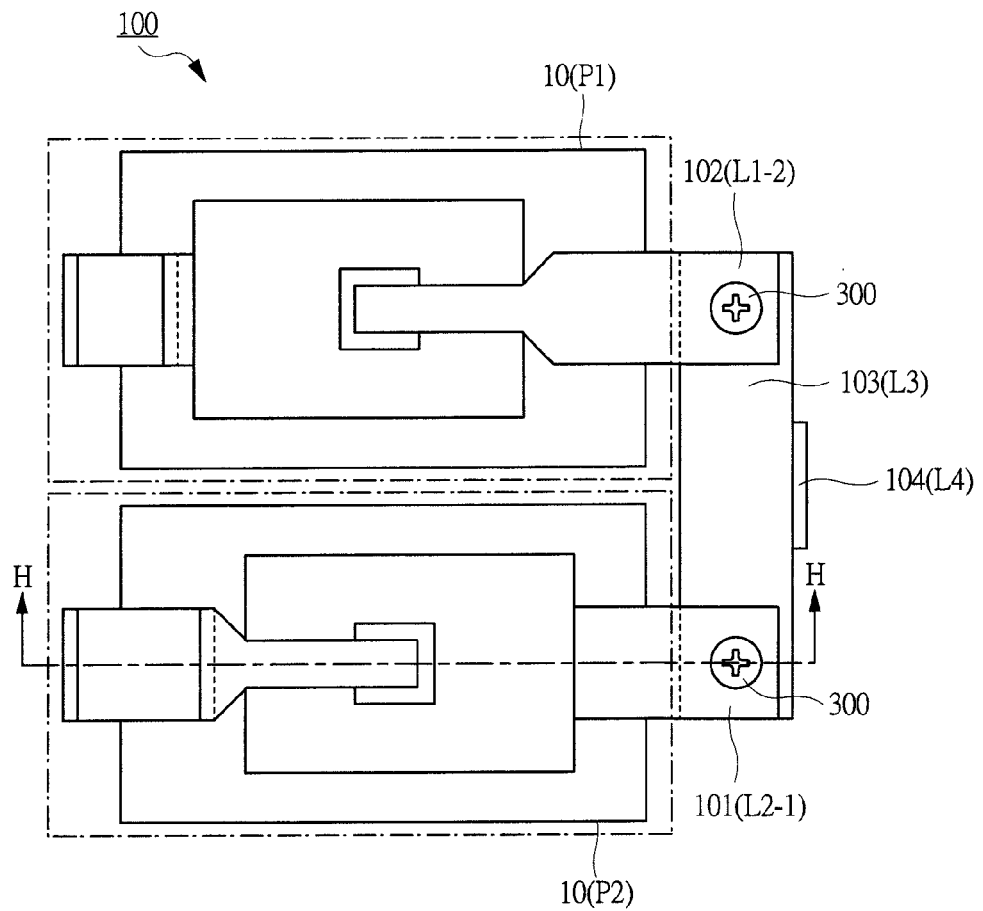
FIG. 10A is an upper plan view illustrating a structure of a semiconductor device according to a seventh embodiment of the present invention.
Figure 10B:
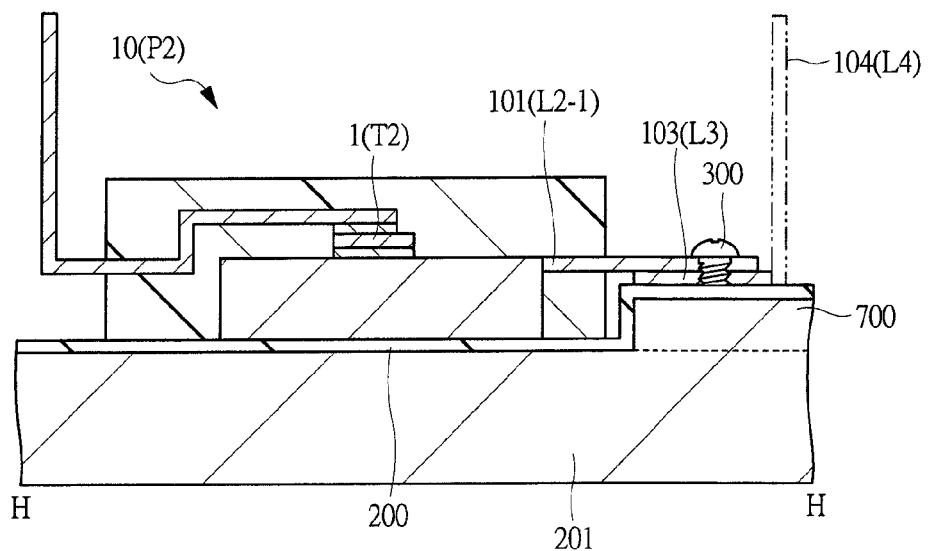
FIG. 10B is an H-H cross-sectional view illustrating a structure of the semiconductor device according to the seventh embodiment.

Next, with reference to FIGS. 10A and 10B, a semiconductor device 100 according to a seventh embodiment will be described. FIG. 10A illustrates an upper plane structure of the semiconductor device 100 according to the seventh embodiment, and FIG. 10B illustrates an H-H (P2) cross section of the same.

In the seventh embodiment (FIGS. 10A and 10B), a different point from the embodiments described above is that an inductive conductor protruding portion 700 is provided on the inductive conductor 201 side so that a portion of the inductive conductor 201 positioned at a lower side of the third lead 103 (L3) is closer to L3. In addition, each of L1-2 and L2-1 has a straight shape.

According to the present configuration, similarly to the embodiments described above, L3 is contacted with the insulating member 200, so that it is easy for the induced current to follow in the inductive conductor 201 and the inductive conductor protruding portion 700, thereby reducing the inductance. Also, similarly to the embodiments described above, the input/output portions of the closed loop 303 are adjacently arranged, and thus the inductance reduction efficiency can be improved. Note that, while L3 is contacted with the insulating member 200 in the present embodiment, the second insulating member 202 may be provided between L3 and the insulating member 200 similarly to the embodiments described above.

Eighth Embodiment

Figure 11A:
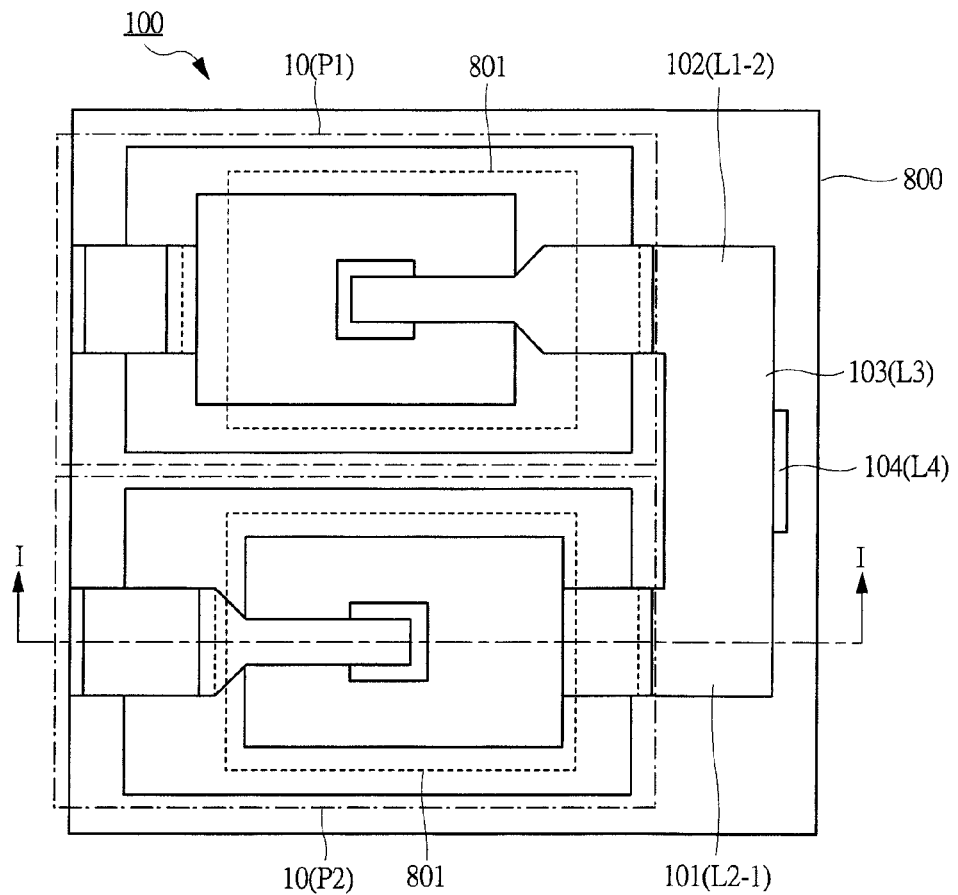
FIG. 11A is an upper plan view illustrating a structure of a semiconductor device according to an eighth embodiment of the present invention.
Figure 11B:
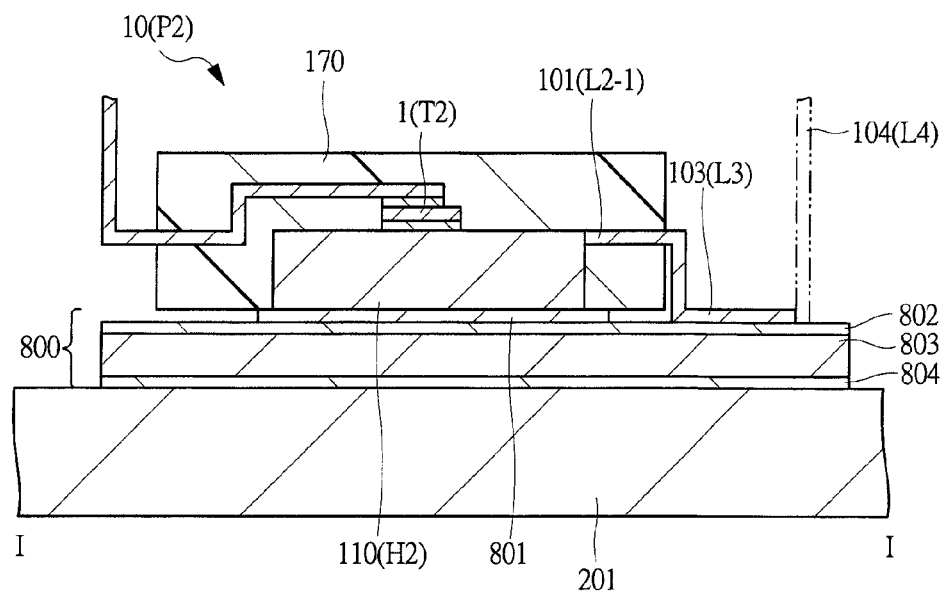
FIG. 11B is an I-I cross-sectional view illustrating a structure of the semiconductor device according to the eighth embodiment.

Next, with reference to FIGS. 11A and 11B, a semiconductor device 100 according to an eighth embodiment will be described. FIG. 11A illustrates an upper plane structure of the semiconductor device according to the eighth embodiment, and FIG. 11B illustrates an I-I (P2) cross section of the same.

In the eighth embodiment (FIGS. 11A and 11B), a different point from the embodiments described above is that the semiconductor packages 10 (P1, P2) are mounted on a metal substrate 800. The metal substrate 800 is formed of a thin-film conductor 801, an insulating material 802, and a metal layer 803. The thin-film conductor 801 is formed of electrically insulated two islands, one of them being positioned to be in contact with the heat spreader 110 (H1) of the first semiconductor package 10 (P1), and the other one being positioned to be in contact with the heat spreader 110 (H2) of the second semiconductor package 10 (P2) (illustrated by the broken lines in FIG. 11A). Further, the metal substrate 800 is in contact with the inductive conductor 201 via a heat-dissipation grease 804.

In the present structure, the third lead 103 (L3) is contacted with the insulating member 802 of the metal substrate 800, so that it is easy for the induced current to be induced in the metal layer 803, thereby reducing the inductance. Also, similarly to the embodiments described above, the input/output portions of the closed loop 303 are adjacently arranged, and thus the inductance reduction efficiency can be improved. Note that, similarly to the embodiments described above, the second insulating member 202 may be sandwiched between the third lead 103 (L3) and the insulating member 802.

Ninth Embodiment

Figure 12A:
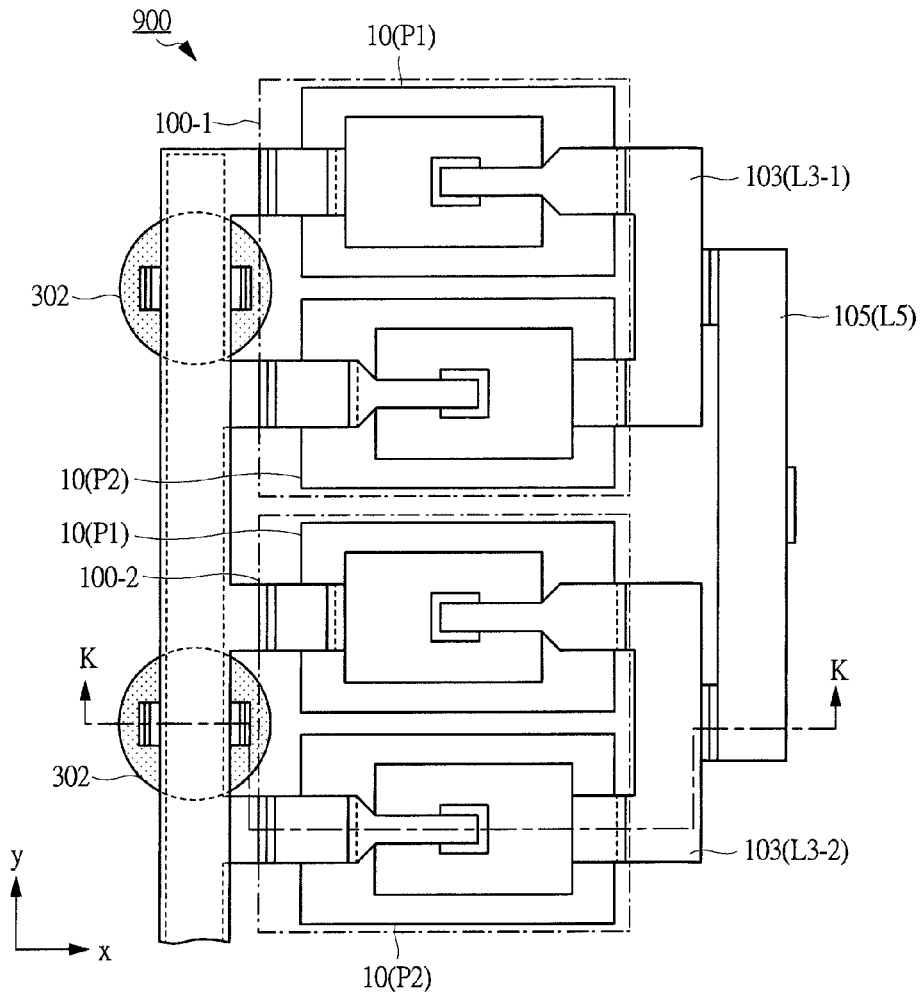
FIG. 12A is an upper plan view illustrating a structure of a semiconductor device according to a ninth embodiment of the present invention.
Figure 12B:
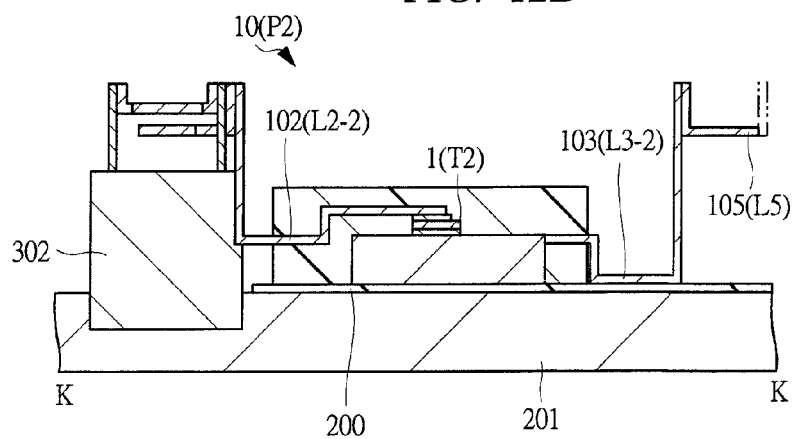
FIG. 12B is a K-K cross-sectional view illustrating a structure of the semiconductor device according to the ninth embodiment of the present invention.
Figure 13:
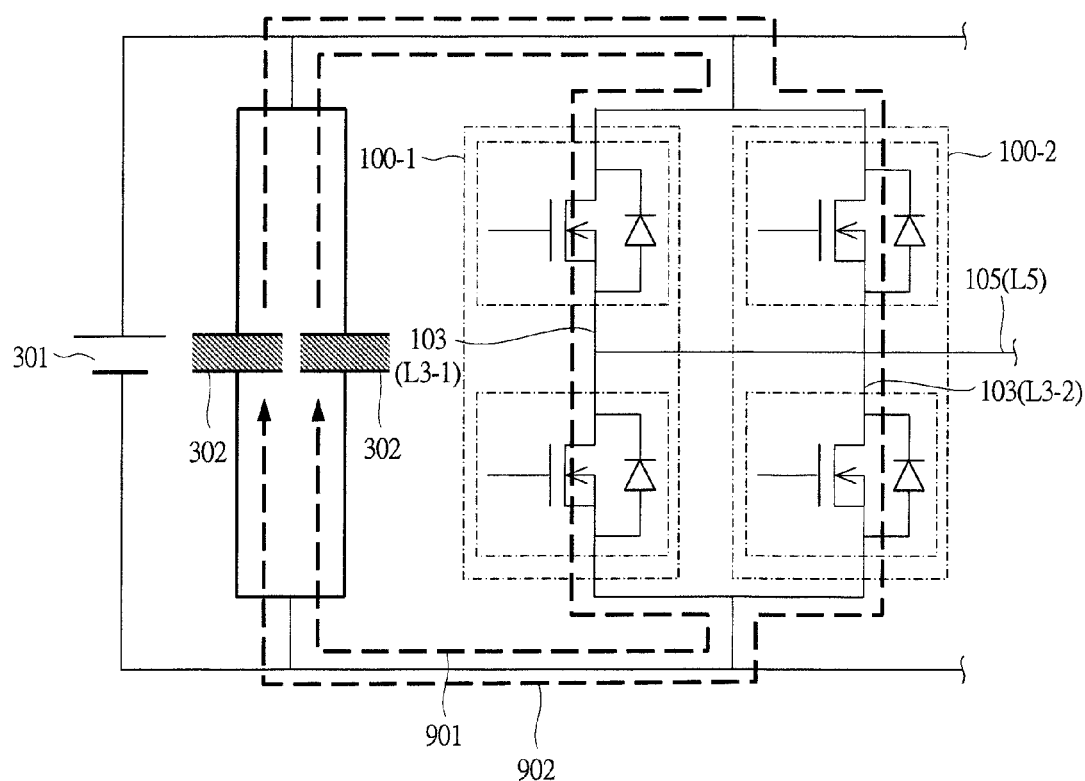
FIG. 13 is a diagram illustrating a circuit of a part of a power conversion device configured with using a semiconductor device according to the ninth embodiment.

Next, with reference to FIGS. 12A and 12B and FIG. 13, a semiconductor device 900 according to a ninth embodiment will be described. FIG. 12A illustrates an upper plane structure of the semiconductor device 900 according to the ninth embodiment, and FIG. 12B illustrates a K-K (100-2, P2) cross section of the same. FIG. 13 illustrates a circuit of a power conversion device configured by using the semiconductor device 900.

In the ninth embodiment (FIGS. 12A and 12B and FIG. 13), a different point from the embodiments described above is that two (a pair of) semiconductor devices corresponding to the semiconductor devices 100 described above are used, and arranged in parallel in the same direction in a plane (x-y) in the semiconductor device 900, and further, the two (pair of) semiconductor devices 100 configure a parallel circuit as illustrated in FIG. 13.

In the semiconductor device 900, a third lead 103 (L3-1) of a first semiconductor device 100-1 and a third lead 103 (L3-2) of a second semiconductor device 100-2 are electrically connected by a fifth lead 105 (L5). L5 has a role same as that of L3 and L4 (joint per the semiconductor device 100, external output terminal, etc.) of the embodiments described above. Leads of each input/terminal portions are connected to a smoothing capacitor 302 and so forth.

The third lead 103 (L3-1) of the first semiconductor device 100-1 is, similarly to the embodiments described above, contacted with the insulating member 200, and thus a closed loop 901 to be an induced current path is formed to the inductive conductor 201, thereby reducing the inductance. Similarly, the third lead 103 (L3-2) of the second semiconductor device 100-2 is also contacted with the insulating member 200, and thus a closed loop 902 to be an induced current path is formed to the inductive conductor 201, thereby reducing the inductance. Note that, similarly to the embodiments described above, the second insulating member 202 may be provided between the third lead 103 and the insulating member 200.

Tenth Embodiment

Figure 14A:
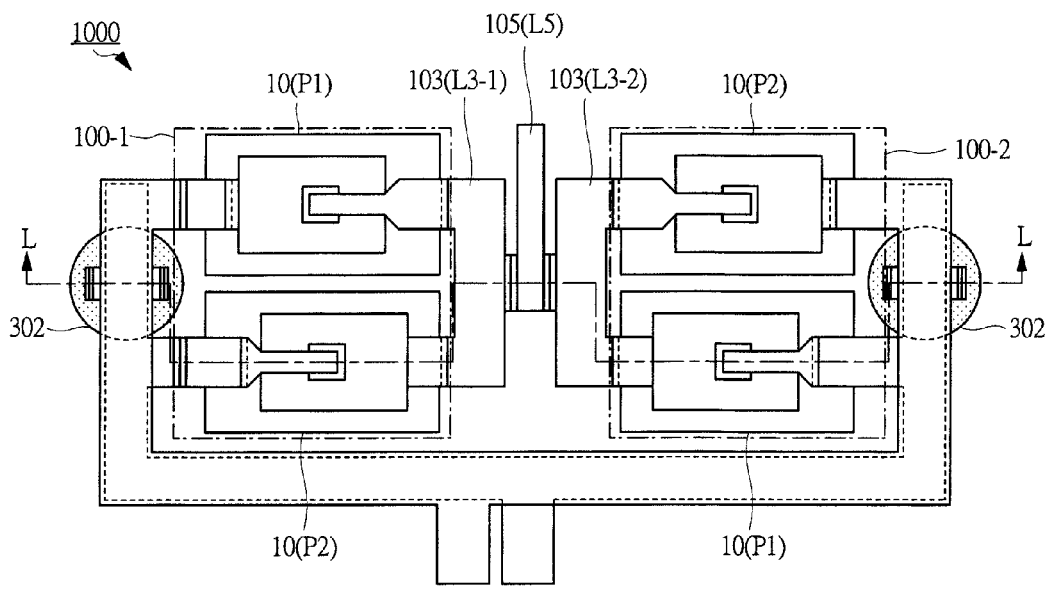
FIG. 14A is an upper plan view illustrating a structure of a semiconductor device according to a tenth embodiment of the present invention.
Figure 14B:
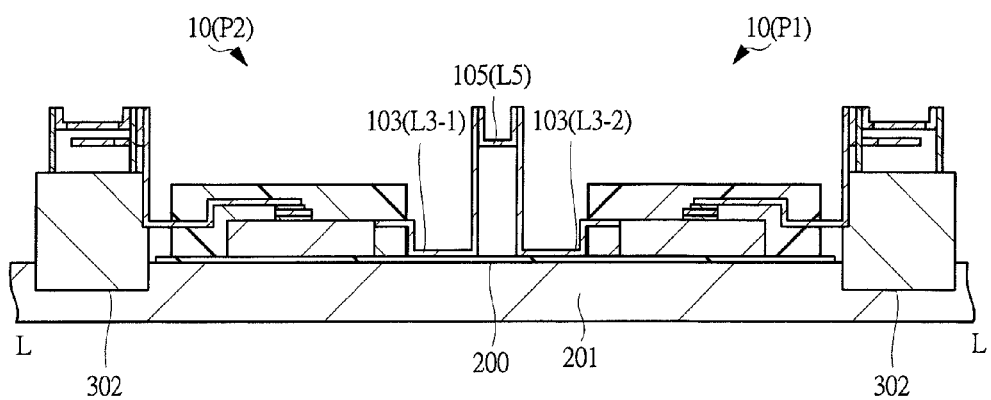
FIG. 14B is an L-L cross-sectional view illustrating a structure of the semiconductor device according to the tenth embodiment of the present invention.
Figure 15:
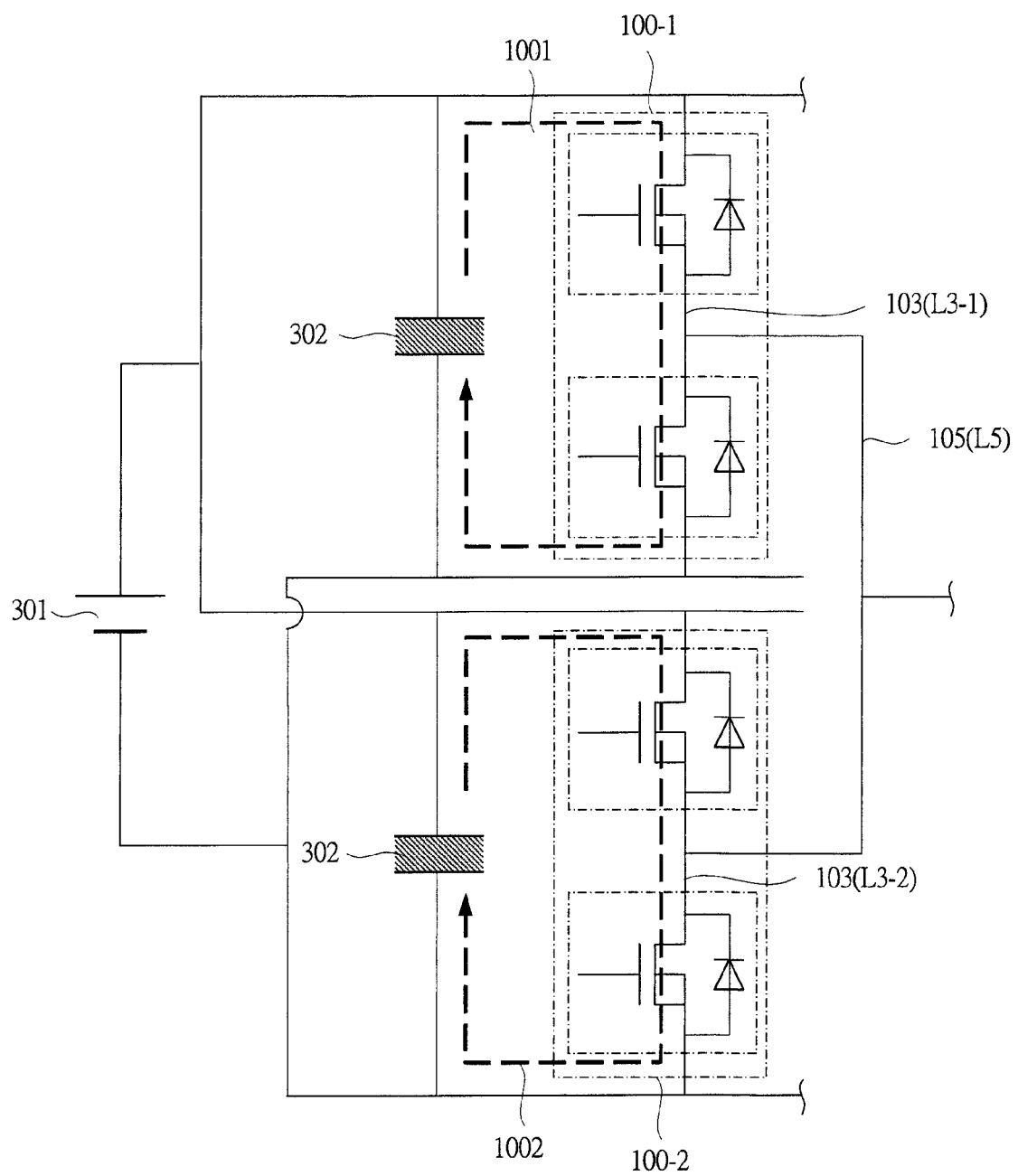
FIG. 15 is a diagram illustrating a circuit of a part of a power conversion device formed with using the semiconductor device according to the tenth embodiment.

Next, with reference to FIGS. 14A and 14B and FIG. 15, a semiconductor device 1000 according to a tenth embodiment will be described. FIG. 14A illustrates an upper plane structure of the semiconductor device 1000 according to the tenth embodiment, and FIG. 14B illustrates an L-L (P2) cross section of the same. FIG. 15 illustrates a circuit of a power conversion device configured with using the semiconductor device 1000.

In the tenth embodiment (FIGS. 14A and 14B, FIG. 15), a different point from the embodiments described above is that two (a pair of) semiconductor devices corresponding to the semiconductor devices 100 described are used, and arranged in series in opposing directions (opposite directions) on a plane (x-y) so that leads on the joint side face each other, and the two (pair of) semiconductor devices 100 configure a parallel circuit as illustrated in FIG. 15.

A third lead 103 (L3-1) of a first semiconductor device 100-1 and a third lead 103 (L3-2) of a second semiconductor device 100-2 are electrically connected by a fifth lead 105 (L5). L5 has a role similar to that of L3 and L4 of the embodiments described above. The lead of each of input and output terminals side is connected to the smoothing capacitor 302 and so forth.

The third lead 103 (L3-1) of the first semiconductor device 100-1 is, similarly to the embodiments described above, contacted with the insulating member 200, and thus a closed loop 1001 to be an induced current path to the inductive conductor 201 is formed, thereby reducing the inductance. Similarly, the third lead 103 (L3-2) of the second semiconductor device 100-2 is also contacted with the insulating member 200, and thus a closed loop 1002 to be an induced current path is formed to the inductive conductor 201, thereby reducing the inductance. Note that, similarly to the embodiments described above, the second insulating member 202 may be sandwiched between the third lead 103 and the insulating member 200.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the metal substrate mounting system (eighth embodiment) and the metal block mounting system (fifth embodiment etc.) described above may be combined.

Also, the semiconductor device (power conversion device etc.) of each embodiment described above can be used for a power conversion device using a power semiconductor element such as a gate turn-off thyristor, etc.

The present invention is applicable to a power conversion device and so forth.

What is claimed is:

1. A semiconductor device comprising at least two semiconductor packages and an inductive conductor connecting the two semiconductor packages, wherein
the semiconductor package includes: a semiconductor element having a first electrode surface electrically connected onto a heat spreader; a first lead electrically connected to the heat spreader and having a part exposed to the outside; a second lead electrically connected to a second electrode surface of the semiconductor element and having a part exposed to the outside; and a mold material resin-molding the heat spreader, the semiconductor element, the first lead, and the second lead,
the two semiconductor packages are arranged on a plane of the inductive conductor via an insulating member, a first semiconductor package of the two semiconductor packages is arranged in a first direction on the plane of the inductive conductor, and a second semiconductor package of the two semiconductor packages is arranged in a second direction opposite to the first semiconductor package, and
a third lead electrically connecting the second lead of the first semiconductor package and the first lead of the second semiconductor package is provided.

2. The semiconductor device according to claim 1, wherein the third lead is arranged in parallel to the plane of the inductive conductor and at a height near the insulating member, and
an external output terminal is provided to a part of the third lead or a part of a fourth lead extended as a continuous member in any direction from the third lead.

3. The semiconductor device according to claim 1, wherein a structure around connecting portions of the second lead of the first semiconductor package and the first lead of the second semiconductor package and the third lead is a bended structure so that a distance between the third lead and the insulating member or the inductive conductor is shortened.

4. The semiconductor device according to claim 1, wherein the second lead of the first semiconductor package, the first lead of the second semiconductor package, and the third lead are integrally formed by a lead frame.

5. The semiconductor device according to claim 1, wherein the second lead of the first semiconductor package, the first lead of the second semiconductor package, and the third lead are formed of different conductors, and connected by joint members.

6. The semiconductor device according to claim 1, wherein a block electrically and continuously connecting between an end portion of the second lead of the first semiconductor package and an end portion of the first lead of the second semiconductor package is provided to an upper portion of the insulating member.

7. The semiconductor device according to claim 1, wherein a part of the inductive conductor facing the third lead has an inductive conductor protruding portion protruding toward the third lead, and the inductive conductor protruding portion and the third lead are adjacently arranged in parallel.

8. The semiconductor device according to claim 1, wherein the inductive conductor is a part of a chassis having a function of a heat-dissipation fin.

9. The semiconductor device according to claim 1, wherein a second insulating member is provided between the third lead and the insulating member.

10. The semiconductor device according to claim 1, wherein
a surface contact portion bent in a perpendicular direction on the plane of the inductive conductor and in contact with a part of the second lead of the first semiconductor package and a part of the first lead of the second semiconductor package, and a part of the third lead is provided, and the part of the second lead of the first semiconductor package and the part of the first lead of the second semiconductor package and the part of the third lead are connected at the surface contact portion by joint members.

11. The semiconductor device according to claim 1, wherein
the two semiconductor packages and the third lead are connected to a plane of a metal substrate provided to an upper side of the plane of the inductive conductor.

12. A semiconductor device using a plurality of the semiconductor devices according to claim 1, wherein the plurality of semiconductor devices are arranged on a plane of an inductive conductor, and a fifth lead electrically connecting the third leads of the plurality of semiconductor devices is provided.

* * * * *